US007024136B2

(12) United States Patent
Fiore et al.

(10) Patent No.: US 7,024,136 B2
(45) Date of Patent: Apr. 4, 2006

(54) METHOD FOR EXTENDING THE LIFETIME OF AN ENDLESS BELT

(75) Inventors: Steven J. Fiore, Hilton, NY (US); Diego Alejandro Pereda, Rochester, NY (US); Michael Nicholas Soures, Webster, NY (US); Jennifer Kciuk, East Rochester, NY (US); Michael Povio, Webster, NY (US); David R. Kamprath, Webster, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/667,268

(22) Filed: Sep. 19, 2003

(65) Prior Publication Data

US 2005/0063731 A1 Mar. 24, 2005

(51) Int. Cl.
*G03F 15/00* (2006.01)

(52) U.S. Cl. ...................................... 399/165; 198/814

(58) Field of Classification Search ................ 399/165, 399/116, 43; 198/813, 814

See application file for complete search history.

(56) References Cited

U.S. PATENT DOCUMENTS

| | | | | |
|---|---|---|---|---|
| 4,416,532 | A * | 11/1983 | Rosati | 399/116 |
| 5,243,384 | A | 9/1993 | Everdyke et al. | |
| 5,282,010 | A | 1/1994 | Popvic | 355/315 |
| 6,101,353 | A * | 8/2000 | Yu et al. | 399/165 |
| 6,185,394 | B1 * | 2/2001 | Lee | 399/116 |
| 6,249,662 | B1 | 6/2001 | Lee | |
| 6,269,231 | B1 | 7/2001 | Castelli et al. | 399/165 |
| 6,560,428 | B1 | 5/2003 | Sanchez-Banos et al. | |

* cited by examiner

*Primary Examiner*—Arthur T. Grimley
*Assistant Examiner*—Ryan Gleitz
(74) *Attorney, Agent, or Firm*—Joseph M. Young

(57) ABSTRACT

An apparatus and method for extending the lifetime of belts, especially photoreceptor belts inside of a printing device, which includes detensioning the belt during periods where the belt is not in use, such as where a printing device is in an idle state.

11 Claims, 5 Drawing Sheets

METHOD FOR EXTENDING THE LIFETIME OF AN ENDLESS BELT

The present invention relates to printing devices and more precisely to a method and apparatus for increasing the lifetime of a photoreceptor belt.

During operation of an electrophotographic printing device, the photoreceptor belt is highly tensioned to enable a flat belt in critical areas such as, for example, development and transfer. However, the high tension on the belt eventually causes the surface coating(s) to suffer defects such as micro cracking, especially during idle periods. The surface layer of a photoreceptor belt is important to the quality of the output images.

Belt lifetimes could be extended if they were suitably detensioned during periods of nonuse. However, the belt cannot be detensioned too much within an electrophotographic device as it may contact surrounding modules, thereby damaging its surface or the surrounding modules. Like many technologies, there is always a desire for printing devices that operate faster, have more features, and occupy less space. This can lead to the interior of the device becoming crowded.

To increase the lifetimes of photoreceptor belts, described embodiments include a method for extending the lifetime of a belt, comprising detensioning the belt during the period of time when the printer is idle.

Embodiments also include a tension control apparatus for detensioning a endless belt, wherein the belt is wrapped around a support apparatus including at least one support for the belt, a tensioning member, and a biasing means acting on the tensioning member. The tension control apparatus includes a frame connected to the support apparatus, a cam connected to the frame, and a first lever arm having first and second ends. The first lever arm is pivotally connected to the frame at a pivot point between the first and second ends of the first lever arm. The first end of the first lever arm is positioned such that when the cam is rotated, the cam causes the first lever arm to pivot about the pivot point such that the second end of the first lever arm engages the biasing means such that the biasing means no longer acts on the tensioning member.

Various exemplary embodiments will be described in detail, with reference to the following figures, wherein.

Figure 6:
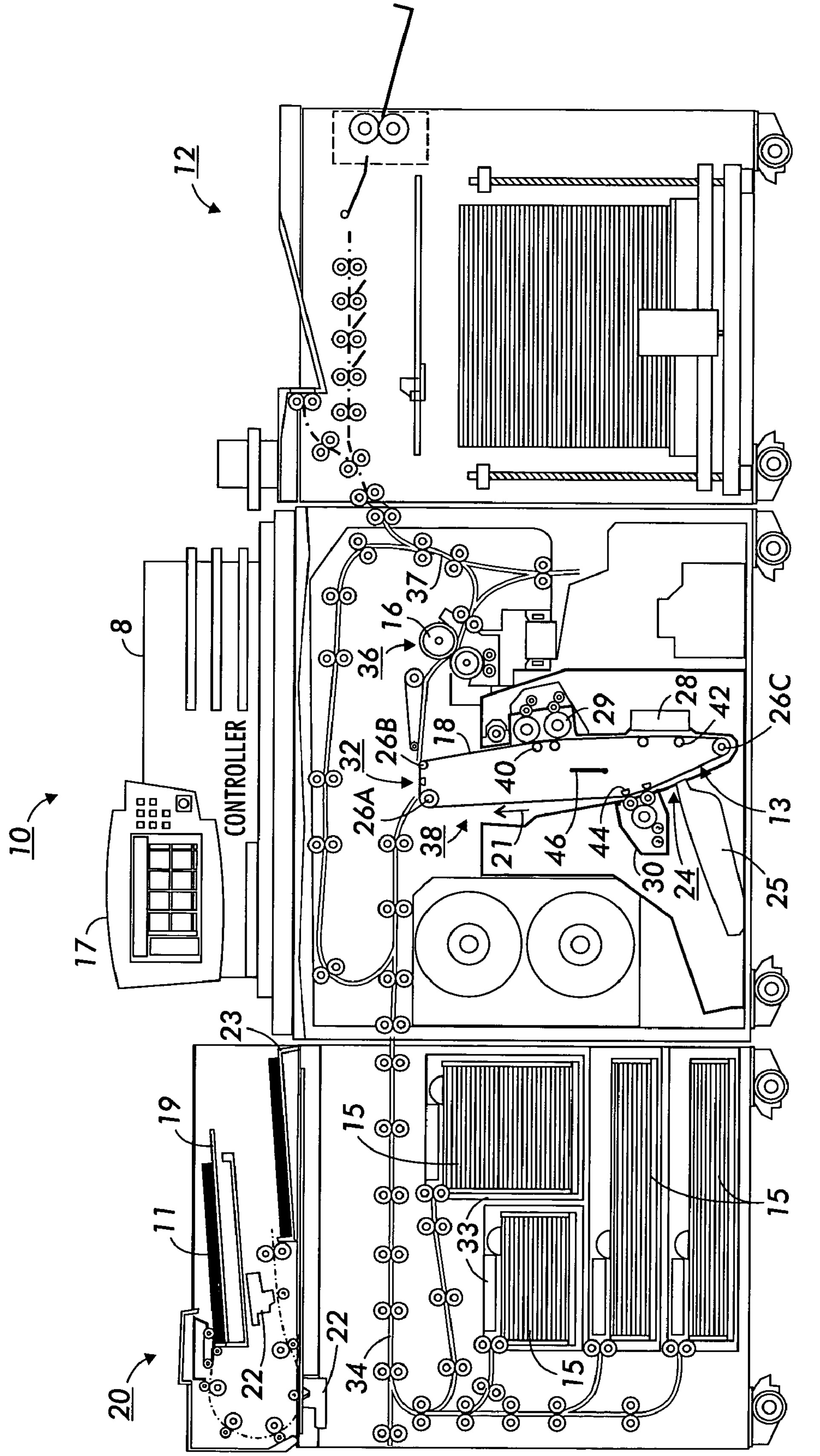
FIG. 6 is a schematic front elevation view of an exemplary embodiment of a photoreceptor module.

FIG. 6 shows a schematic front elevation view of an exemplary embodiment of a photoreceptor module 38 in the context of a printing device 10. The printing device 10 could be, for example, a xerographic copier or printer.

In the exemplary embodiment of the printing device 10, an image of an original document or set of documents 11 to be reproduced is projected or scanned onto a uniformly charged surface 13 of a photoreceptor belt 18 to form an electrostatic latent image thereon. Thereafter, the latent image is developed with an oppositely charged developing material called toner (not shown) to form a toner image, corresponding to the latent image on the photoreceptor surface. The toner image is then electrostatically transferred to a final support material or paper sheet 15, to which it may be permanently fixed by a fusing device 16.

In the illustrated device 10 of FIG. 6, a set of original documents 11 to be copied is placed on tray 19 of an automatic document handler 20. The machine operator enters the desired copying instructions, such as, for example, number of copies or sets of copies, through the control panel 17. The automatic document handler transports the documents 11 serially from the tray and past a scanning station 22 which scans each document, thereby producing digital image signals corresponding to the informational areas on the original document. Once scanned, the printing device 10 deposits the documents in an output tray 23. Additionally, information and instructions could come from a data storage medium or, if the device is connected to a network, they could come from a remote location such as a desktop computer.

The image signals are projected upon the uniformly charged surface of the photoreceptor at an imaging station 24 by a raster output system 25 to form a latent electrostatic image of the scanned informational areas of the original document thereon as the photoreceptor is moved passed the imaging station. The photoreceptor 18 is in the form of a flexible, endless belt 18 having a photoconductive outer surface 13 and is mounted on a photoreceptor module 38. A set of rollers 26A, 26B, 26C and a plurality of backing members located opposite various stations support the belt 18. At least one of the rollers 26A is driven to move the photoreceptor belt 18 in the direction indicated by arrow 21 at a constant rate of speed about the rollers and past the various xerographic processing stations. Before entering the imaging station 24, a charging station 28 uniformly charges the photoreceptor surface 13. Exposing the charged surface of the photoreceptor to the digital signals at the imaging station discharges the photoreceptor surface in the areas struck by the digital image signals. Thus, there remains on the photoreceptor surface a latent electrostatic image in image configuration corresponding to the informational areas on the original. As the photoreceptor continues its movement, the latent electrostatic image thereon passes through developing station 30 which deposits oppositely charged toner on the latent electrostatic image to form a toner image.

The photoreceptor movement continues transporting the toner image from the developer station to a transfer station 32. A paper supply 33 feeds a sheet 15 to a sheet transport 34 for travel to the transfer station. The sheet moves into aligned and registered contact with the toner image at a speed synchronistic with the moving photoreceptor. The toner image is transferred to the sheet is and the sheet with the toner image is stripped from the photoreceptor belt 18. The sheet is then conveyed to a fusing station 36 having fuser device 16, which fuses the toner image to fix permanently the toner image to the sheet. After the toner image is fixed to the sheet, the sheet is transported by sheet transporting mechanism 37 to a finishing station 12 where the sheets with the permanent images thereon may be compiled into sets of sheets and finished by being stapled, bound, or the like.

Suitable drive means (not shown) for the document creating apparatus are arranged to drive the photoreceptor in timed relationship to the scanning of the original document, to forming the latent electrostatic image on the photoreceptor, to effect development of the latent electrostatic image, to separate and feed sheets of paper, to transport same through the transfer station in time registration with the toner image, and to convey the sheet of paper with the toner image through the fusing station to fix the toner image thereto in a timed sequence to produce copies of the original documents.

The foregoing description is believed to be sufficient for the purposes of showing the general operation of a document creating apparatus.

In order to drive the endless photoreceptor belt 18 and keep it flat at various stations such as, for example, the development 30 and transfer 32 stations, the belt should be kept at a high level of tension. During idle times, the belt does not need to be kept at as high a tension. Keeping the belt at high tension level during idle times stretches the belt and causes minute cracks to appear. These in turn lead to copy quality defects and shorter belt lifetimes. In order to lengthen the lifetime of photoreceptor belts, it is proposed that photoreceptor belts be detensioned whenever the printer is idle.

Ideally, the tension in the belt would be reduced to zero. In the absence of other factors, this would generally lead to the longest lifetime for the belt. However, in many cases, the photoreceptor belt cannot be fully detensioned. The inside of most modern printing devices are fairly crowded with components. If the belt were fully detensioned, it would tend towards a more circular loop shape and very likely contact surrounding components within the printing device. This could cause damage to both the belt and to the surrounding components. Therefore, the tension is kept at a small but finite amount. In embodiments, the tension on the belt is approximately one-tenth of the normal operating tension.

In embodiments, whenever a printing device, such as the device 10 of FIG. 6, goes into an idle state, the belt should automatically detension by a controlled amount. This could be accomplished by simply programming a controller 8 to detension the belt 18 when the printer entered an idle state. The belt usually enters an idle state a predetermined time period after the last print job has completed.

Depending on the structure of the particular photoreceptor module or printing device, various mechanisms or methods for detensioning could be used. In embodiments, the machine goes into an idle, lower power consumption mode a predetermined period of time after the last print job had completed. At this point, the tension of the belt is reduced to a lower level. When a new print job is started, the belt tension would be increased up to an operational level. In other embodiments, the user could manually cause the tension in the belt to reduce to its idle level, when the user was finished. If manual reduction is allowed, the printing device may be equipped with either an automatic retensioning device if a new print job is started, or it may be equipped with a failsafe so it will not restart until the user increases the tension of the belt to an operable level.

To accomplish the task of decreasing and increasing the tension in the belt, the photoreceptor module 38 can be equipped with a tension control mechanism. The tension control mechanism could be external to the photoreceptor module. However, in many devices, this design would be impractical if not impossible given the space constraints inside typical printing devices. The exemplary module 38 in FIG. 1 is equipped with an exemplary detensioning mechanism 50.

Figure 1:
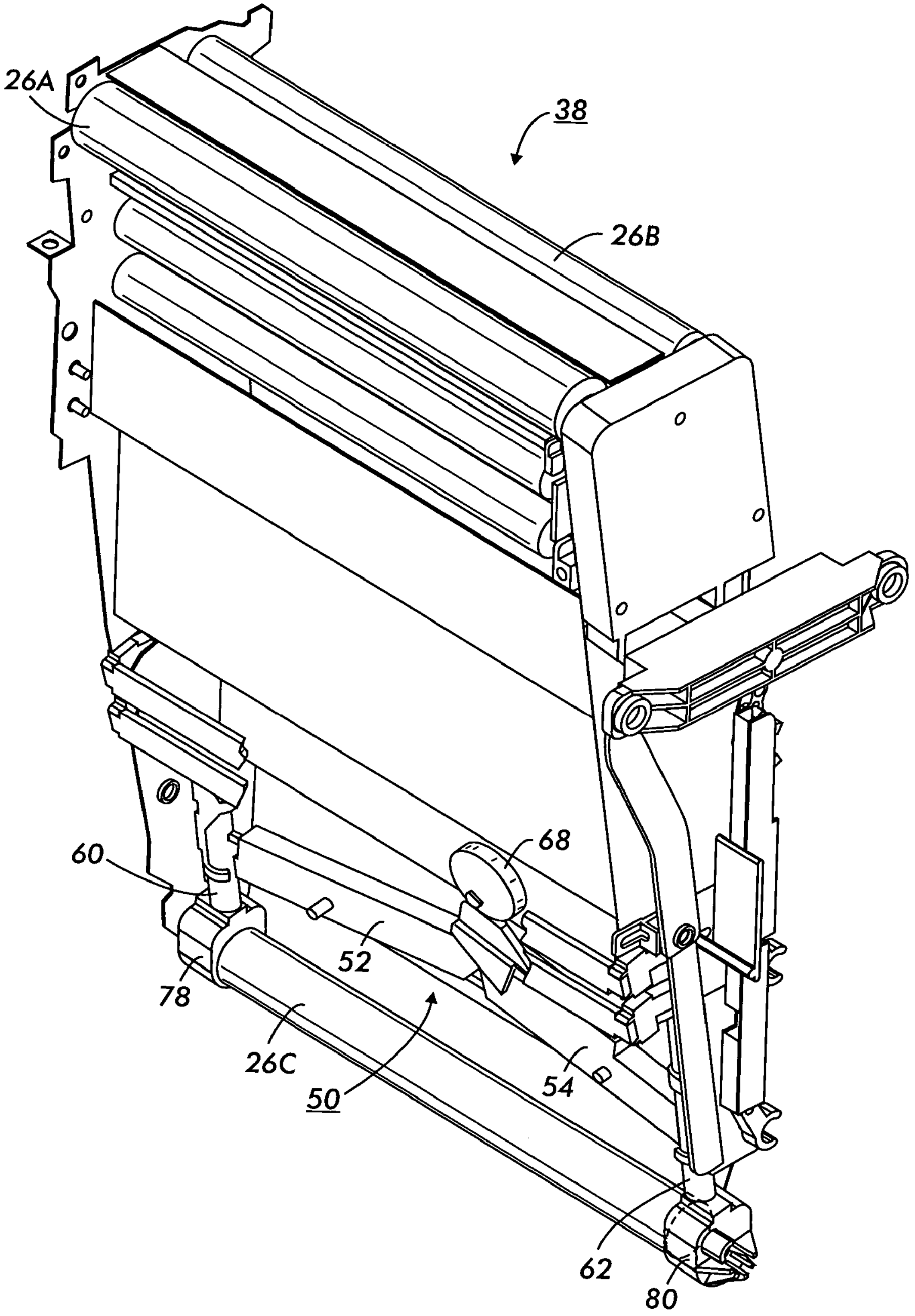
FIG. 1 is a schematic illustration of a perspective view of an embodiment of a photoreceptor module having an exemplary detensioning mechanism.

FIG. 1 illustrates the photoreceptor module 38 without its belt 18. With the belt 18 removed, the tensioning member is visible. In embodiments, the tensioning member is a tension roller 26C as shown in FIG. 1. The detensioning mechanism 50 is also visible in FIG. 1. In the photoreceptor module 38, the tension roller 26C is used to provide tension in the belt 18. Edge guides 78, 80 hold the tension roller 26C in place. The tension roller mounting arms (see FIGS. 2–5) are connected to the edge guides 78, 80. Surrounding the tension roller mounting arms are sleeves 60, 62, which supply a biasing force to the tension roller to keep the tension in the belt sufficiently high for operating purposes. In embodiments, the sleeves provide spring-loaded pressure to the tension roller 26C. This pressure keeps the tension roller 26C in an extended state, such that the belt has sufficient tension during operation of the printing device 10.

The mechanism 50 reduces the amount of tension supplied by the tension roller 26C by reducing the pressure the sleeves apply to the tension roller 26C. To reduce the tension in the belt 18 when printing device 10 is idle, the mechanism 50 engages and lifts sleeves 60, 62. When the sleeves are lifted, the only force contributing to tension in the belt 18 is gravity acting on the belt 18 and on the roller 26C.

Figure 2:
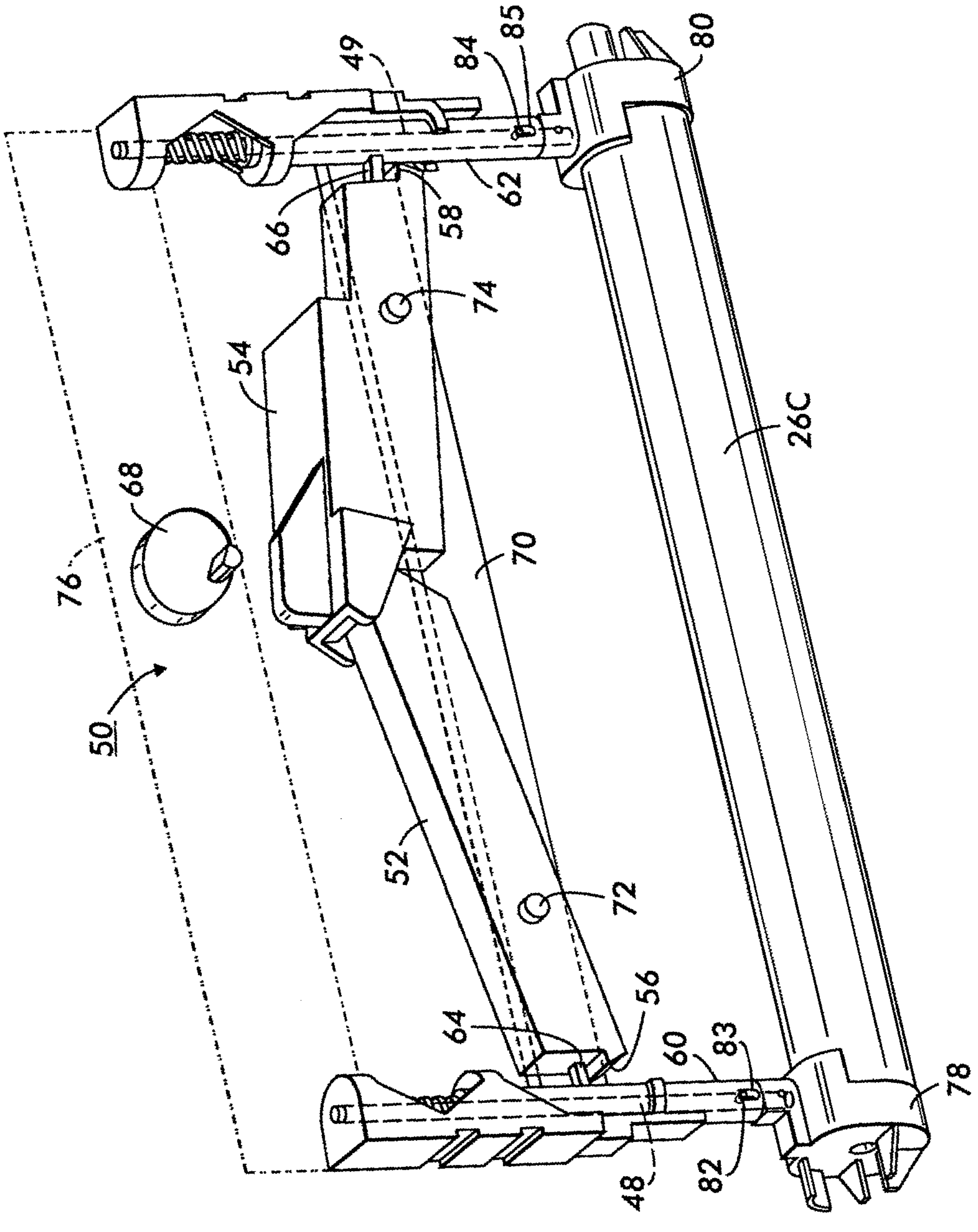
FIG. 2 is a schematic illustration of the tensioning mechanism shown with the module of FIG. 1 in a first operating position.
Figure 3:
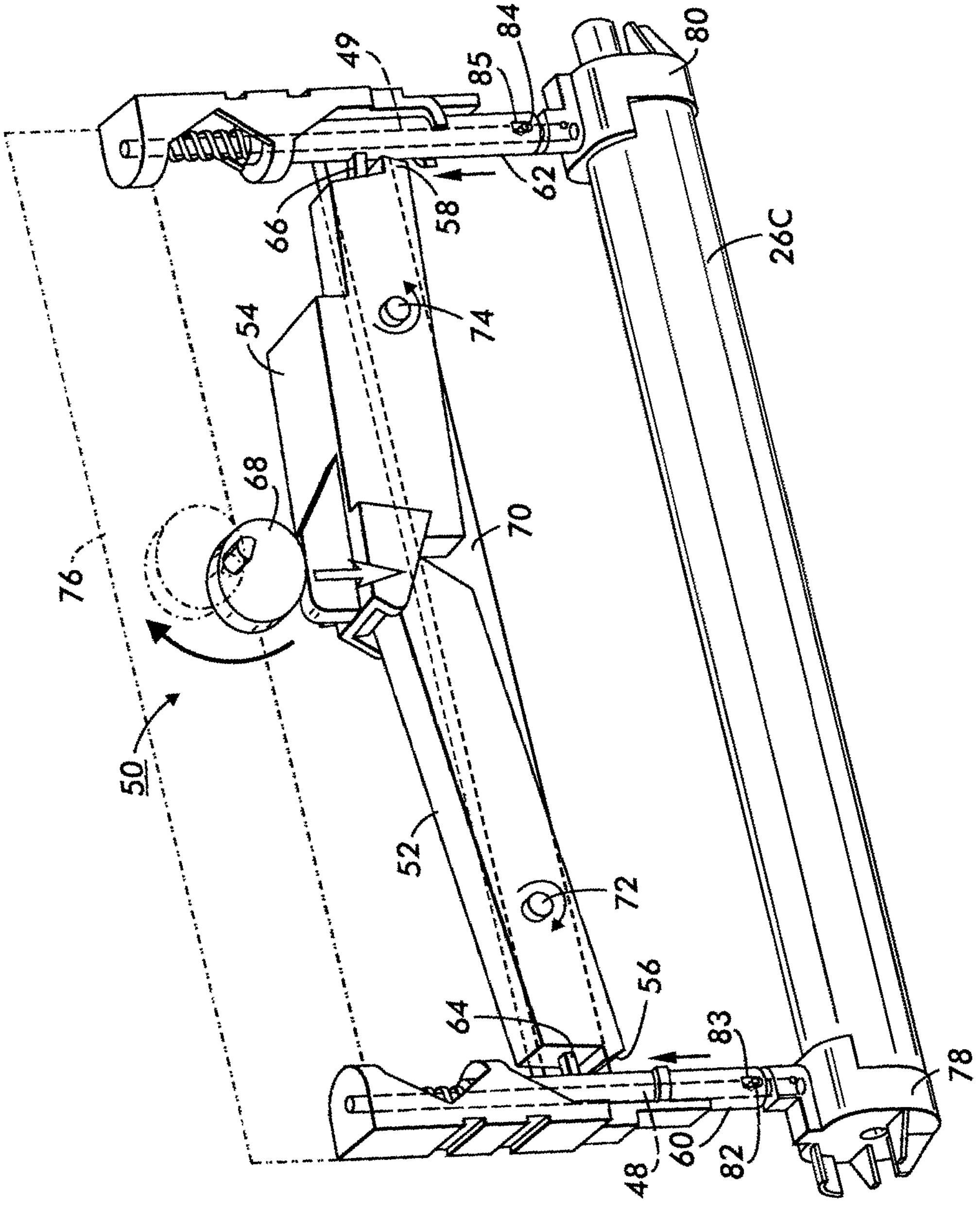
FIG. 3 is a schematic illustration of the tensioning mechanism shown with the module of FIG. 1 in a second lower tension position.

FIGS. 2–3 offer a better view of the mechanism 50. FIG. 2 illustrates the detensioning mechanism 50 when the belt is fully tensioned for printing. FIG. 3 shows the mechanism 50 when the belt is detensioned during an idle period.

The detensioning mechanism 50 includes first and second detensioning arms 52, 54. Each detensioning arm 52, 54 has an inner portion and an outer portion. The outer portion of each arm 52, 54 includes a small arm protrusion 56, 58 at an outer end. The mechanism 50 also interacts with the two sleeves 60, 62 that surround the tension roller mounting arms 48, 49. Each sleeve 60, 62 includes a small sleeve protrusion 64, 66. As noted above, the mounting arms 48, 49 are connected to edge guides 78, 80. In FIGS. 2–3, pins 82, 84, which extend outward from mounting arms 48, 49, and slots 83, 85 in sleeves 60, 62 are visible. These will be described in more detail with respect to FIGS. 4 and 5. The mechanism 50 also includes a cam 68.

Each detensioning arm 52, 54 is mounted to an arm support frame 70 at a point approximately one third its length from its inner end. Connection holes 72 and 74 are visible in FIGS. 2–3. Cam 68 is also mounted to a cam support frame 76. In FIGS. 1–3, the detensioning arm support frame 70 and the cam support frame 76 are shown as separate components. However, they may be connected to or integral with each other.

Figure 4:
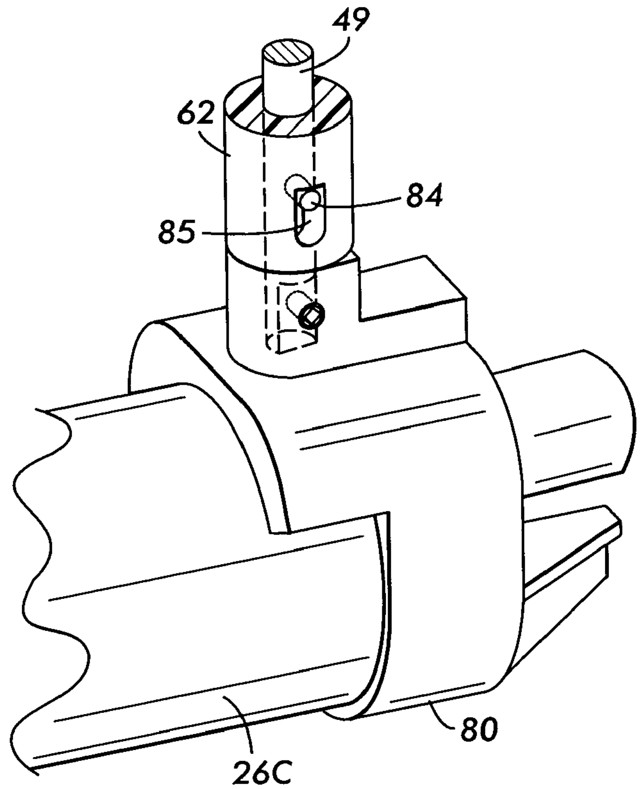
FIG. 4 is a schematic illustration of a tensioning sleeve portion of the tensioning mechanism when it is in the position shown in FIG. 2.

FIG. 4 illustrates a close up of one end of the tension roller 26C and the corresponding mounting arm 49 sleeve 62, and edge guide 80. In this view, it is easier to see pin 84 and slot 85. Pin 84 extends outward through slot 85 from arm mounting arm 49. When the photoreceptor belt 18 is at its operating tension, the sleeve 62 is in a lowered position where it pushes downward on pin 84, which, in turn, pushing downward on edge guide 80. Similarly sleeve 60 pushes downward on pin 82 connected to arm 48, which In turn pushes down on edge guide 78. The combined downward force extends the tension roller to its operating position.

Referring to FIG. 3, when the printing device 10 idles for a sufficient amount of time, the cam 68 is rotated (automatically or manually). The cam 68 pushes the inner portion of the arm 54 downward. The arms are arranged so that the arm 54 applies force to the inner portion of arm 52 as well. When the inner portions of the arms 52, 54 move downward the outer portions of the arms move upward about the pivot points 72, 74. When this happens the arm protrusions 56, 58 contact and press upward on the sleeve protrusions 64, 66. In turn, the sleeve protrusions 64, 66 raise up and the tension roller no longer has any spring-loaded pressure on it. Now the only force contributing to tension in the belt 18 is gravity acting on both the belt 18 and on the roller 26C.

Figure 5:
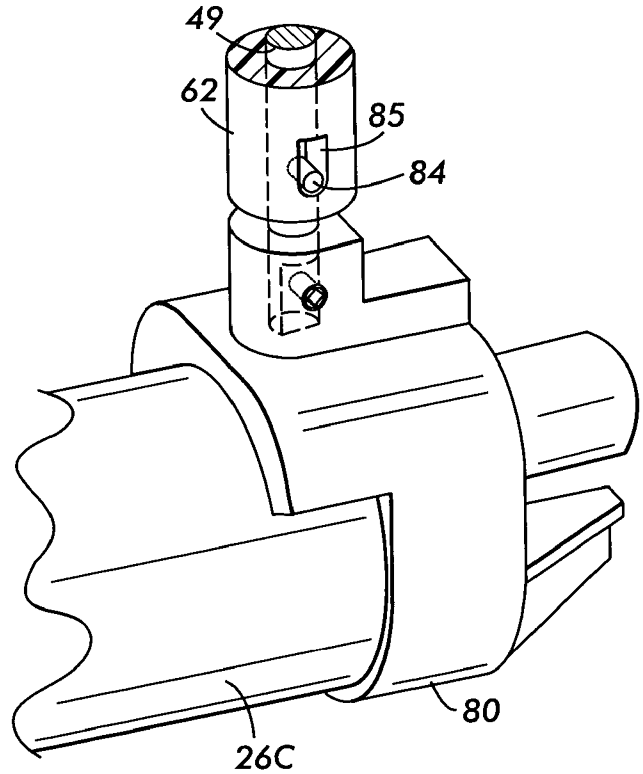
FIG. 5 is a schematic illustration of a tensioning sleeve portion of the tensioning mechanism when it is in the position shown in FIG. 3.

Referring to FIG. 5, the sleeve 62 can be seen in its lifted position. In this position, the sleeve 62 is elevated such that it no longer presses downward on pin 84. Similarly, when the other sleeve 60 is in its raised position, it no longer presses downward on pin 82. In embodiments, the sleeve is raised a distance of approximately 3.5 mm.

As illustrated, sleeve 62 does not lift pin 84. Instead, the tension roller 26C is permitted to essentially hang by its own weight. Reducing tension in the belt 18 to merely that of the weight of the tension roller 26C at its unbiased extension is usually sufficient to reduce wear on the belt. However, if the weight of the tension roller 26C were such that it still caused noticeable wear on the belt, embodiments can also include those where the mechanism 50 raises sleeves 60, 62 such that they apply upward force on pins 82, 84.

In the embodiment illustrated in FIGS. 2–3, the cam is rotated approximately 180°. However, depending on the shape of the cam and the position of its axis, the amount of rotation necessary to alter the tension from a working higher tension position to an idle lower tension position may be different. However, the basic concept would be the same.

The methods described herein could also be used outside the context of photoreceptor belts. Tension on any belt while not in use will age the belt. If that tension could be substantially reduced during periods of nonuse, the lifetime of those belts could be extended as well.

While the present invention has been described with reference to specific embodiments thereof, it will be understood that it is not intended to limit the invention to these embodiments. It is intended to encompass alternatives, modifications, and equivalents, including substantial equivalents, similar equivalents, and the like, as may be included within the spirit and scope of the invention.

The invention claimed is:

1. A method for extending the lifetime of a photoreceptor belt, wherein a spring-loaded mechanism supplies a force to a tensioning member that tensions the belt when in its operational position inside of a printing device, comprising reducing the tension in the belt by substantially completely removing the force supplied by the spring-loaded mechanism from the tensioning member when the printing device enters an idle state without substantially completely removing the tension in the belt.

2. The method of claim 1, wherein the tension in the belt is reduced manually.

3. The method of claim 1, wherein the tension in the belt is reduced automatically.

4. The method of claim 3, further comprising determining that the printing device is in an idle state a fixed period of time after the last job has printed.

5. The method of claim 1, wherein the tension in the belt is reduced to a reduced tension that is greater than zero but less than the full operating tension.

6. The method of claim 5, wherein the reduced tension is sufficient to prevent the surface of the belt from contacting other components inside the printing device.

7. The method of claim 1, further comprising increasing the tension in the belt to an operational tension when the printing device enters an operational state.

8. The method of claim 1, wherein the force supplied by the spring-loaded mechanism from the tensioning member is removed such that only gravity and the belt supply force to the tensioning member.

9. An endless belt tensioning apparatus, wherein the belt is wrapped around a support apparatus including at least one support for the belt, a tensioning member, and a biasing means acting on the tensioning member, the tension control apparatus comprising:

a frame connected to the support apparatus;

a cam connected to the frame;

a first lever arm having first and second ends;

wherein the biasing means includes a first spring-loaded mechanism for providing a biasing force and a first sleeve for transmitting the biasing force to the tensioning member, wherein the first lever arm is pivotally connected to the frame at a pivot point between the first and second ends of the first lever arm, wherein the first end of the first lever arm is positioned such that when the cam is rotated, the cam causes the first lever arm to pivot about the pivot point such that the second end of the first lever arm engages the first sleeve of the biasing means such that the biasing force from the first spring-loaded mechanism is no longer transmitted to the tensioning member.

10. The tension control apparatus of claim 9, wherein the belt is a photoreceptor belt.

11. The tension control apparatus of claim 9, further comprising a second lever arm having first and second ends, wherein the biasing means includes a second spring-loaded mechanism for providing a second biasing force and a second sleeve for transmitting the second biasing force to the tensioning member, wherein the second lever arm is pivotally connected to the frame at a pivot point between the first and second ends of the second lever arm, wherein the first end of the second lever arm is positioned such that when the cam is rotated, the cam causes the second lever arm to pivot about the pivot point such that the second end of the second lever arm engages the second sleeve of the biasing means such that the biasing force from the second spring-loaded mechanism is no longer transmitted to the tensioning member.

* * * * *